United States Patent
Mohanty et al.

(10) Patent No.: US 9,812,325 B2
(45) Date of Patent: Nov. 7, 2017

(54) METHOD FOR MODIFYING SPACER PROFILE

(71) Applicant: Tokyo Electron Limited, Minato-ku, Tokyo (JP)

(72) Inventors: Nihar Mohanty, Clifton Park, NY (US); Akiteru Ko, Schenectady, NY (US)

(*) Notice: Subject to any disclaimer, the term of this patent is extended or adjusted under 35 U.S.C. 154(b) by 0 days.

(21) Appl. No.: 15/255,863

(22) Filed: Sep. 2, 2016

(65) Prior Publication Data

US 2017/0069495 A1    Mar. 9, 2017

Related U.S. Application Data

(60) Provisional application No. 62/213,873, filed on Sep. 3, 2015.

(51) Int. Cl.
| | |
|---|---|
| *H01L 21/033* | (2006.01) |
| *B81C 1/00* | (2006.01) |
| *H01L 21/3065* | (2006.01) |
| *H01L 21/308* | (2006.01) |
| *H01L 21/306* | (2006.01) |

(52) U.S. Cl.
CPC ...... *H01L 21/0337* (2013.01); *B81C 1/00404* (2013.01); *H01L 21/3065* (2013.01); *H01L 21/3086* (2013.01); *H01L 21/30604* (2013.01); *Y10S 438/947* (2013.01)

(58) Field of Classification Search
CPC .......... H01L 21/0337; H01L 21/3065; H01L 21/3086; H01L 21/30604; B81C 1/00404; Y10S 438/947
See application file for complete search history.

(56) References Cited

U.S. PATENT DOCUMENTS

| | | | | |
|---|---|---|---|---|
| 8,871,651 | B1* | 10/2014 | Choi | H01L 21/3086 216/12 |
| 2006/0240361 | A1* | 10/2006 | Lee | H01L 21/0338 430/313 |
| 2014/0342559 | A1* | 11/2014 | Wang | H01L 21/30625 438/692 |
| 2015/0214070 | A1* | 7/2015 | deVilliers | H01L 21/32133 438/697 |

OTHER PUBLICATIONS

Korean Intellectual Property Office, Office Action issued in counterpart Korean Application No. 10-2013-7001379 dated May 23, 2017, 6 pp., including English translation.

* cited by examiner

*Primary Examiner* — Anita Alanko
(74) *Attorney, Agent, or Firm* — Wood Herron & Evans LLP

(57) ABSTRACT

Techniques herein provide a process to reform or flatten asymmetric spacers to form a square profile which creates symmetric spacers for accurate pattern transfer. Initial spacer formation typically results in spacer profiles with a curved or sloped top surfaces. This asymmetric top surface is isolated while protecting a remaining lower portion of the spacer. The top surface is removed using a plasma processing step resulting in spacers having a squared profile that enables further patterning and/or accurate pattern transfer.

12 Claims, 3 Drawing Sheets

METHOD FOR MODIFYING SPACER PROFILE

CROSS REFERENCE TO RELATED APPLICATIONS

The present application claims the benefit of U.S. Provisional Patent Application No. 62/213,873, filed on Sep. 3, 2015, entitled "Method for Modifying Spacer Profile," which is incorporated herein by reference in its entirety.

BACKGROUND OF THE INVENTION

This disclosure relates to semiconductor fabrication including spacer-based patterning.

SUMMARY

Self-aligned double/quadruple patterning (SADP/SAQP) techniques are used to create narrow pitch features at 10 nm technology nodes and sub-10 nm technology nodes. Such patterning involves using a sacrificial layer called a mandrel layer that provides mandrels around which a spacer pattern can be formed. Typically, a conformal layer is deposited on mandrels such that spacer material essentially wraps around and over mandrels. Executing a partial, directional etch removes conformal material from tops of mandrels and from underlying material in between mandrels, which leaves conformal material or spacers on sidewalls of the mandrels. After formation of the spacer pattern, a plasma etch process is used to remove the mandrels, leaving a pattern of free-standing spacers, typically at a pitch that is twice the pitch of the mandrel pattern. In other words, a density of the mandrel pattern can be doubled (number of mandrels per unit length). This spacer pattern can then be transferred into underlying layers, or used as mandrels to repeat spacer formation to quadruple the pattern density.

One challenge in spacer-based patterning is the asymmetricity in profile between the spacer side and the mandrel side of the spacers themselves. Techniques herein, however, provide plasma-based etch processing steps to reform or flatten asymmetric spacers to form a square profile which creates symmetric spacers for accurate pattern transfer.

One embodiment is a method for processing a substrate. A substrate is received having spacers positioned on an underlying layer. The spacers define a relief pattern. Each spacer has a first sidewall and a second sidewall on opposing sides of each spacer. The first sidewall and the second sidewall are normal to the underlying layer. The first sidewall is taller than the second sidewall. A filler material is deposited on the substrate. The filler material fills spaces between spacers. The filler material can planarize the substrate such that the spacers are buried. A first etch step is executed that etches a first portion of the filler material until uncovering a top portion of the spacers such that a top of the first sidewall and a top of the second sidewall are both uncovered. A second etch step is executed that isotropically etches the substrate until the top of the first side wall and the top of the second sidewall are approximately equal in height as measured from the underlying layer. The second etch step uses a plasma etch chemistry that etches the spacers at an etch rate that is greater than at least five times an etch rate of the filler material. The filler material is then removed from the substrate such that the spacers remain on the substrate.

Such techniques can improve line edge roughness and line width roughness for better pattern transfer. Spacer profiles are essentially squared by techniques herein to remove undercut that occurs from asymmetric spacers.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

One challenge with spacer-based patterning is the asymmetricity in profile of spacers between the spacer side and the mandrel side. The mandrel side of a given spacer is the sidewall that abutted a mandrel prior to removing the mandrel. The mandrel side typically has a very high spacer mask height. The spacer side is the sidewall that did not abut the mandrel but instead faced another spacer with, typically, a gap or space between the spacer sidewalls (opposing spacer sidewalls). The spacer side typically has a lower spacer mask height. Accordingly, a top surface of a given mandrel typically slopes downwardly from the top of the mandrel side to the top of the spacer side. The top surface can be flat or curved.

Figure 1:
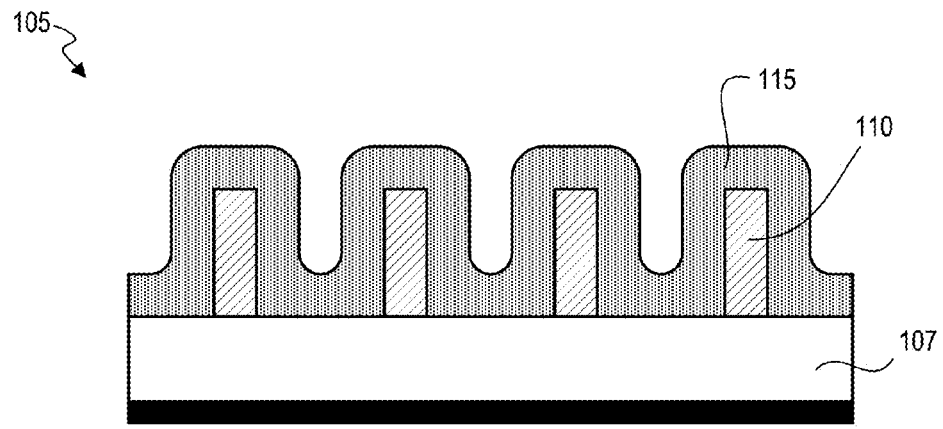
FIG. 1 is a cross-sectional schematic view of an example substrate segment showing spacer formation.

This slope is a product of the mechanics of spacer formation. When a conformal film is wrapped around a set of mandrels, the conformal film is typically rounded on corners, instead of squared. FIG. 1 shows an example substrate 105 with mandrels 110 positioned on underlying layer 107. A conformal film 115 is deposited on substrate 105. The conformal film 115 essentially wraps over the profile of the mandrels. Note, however, that the conformal film 115 is not perfectly conformal and typically results in rounded corners instead of right angle corners.

Figure 2:
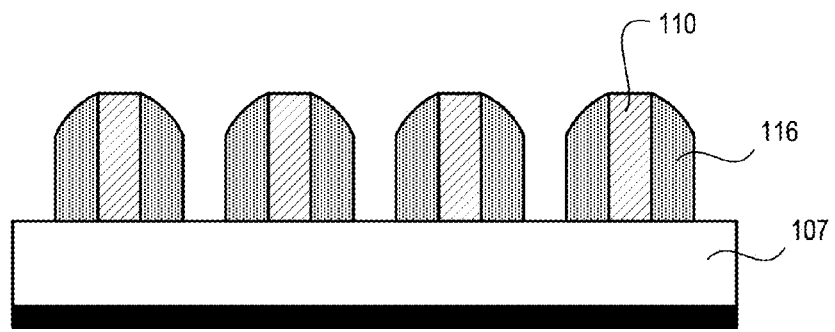
FIG. 2 is a cross-sectional schematic view of an example substrate segment showing spacer formation.

Referring now to FIG. 2, after the conformal film 115 is deposited on the mandrels 110, a spacer etch or spacer open etch can be executed. This spacer-creation etch is typically an anisotropic (directional etch) that is continued until top surfaces of the mandrels are uncovered and floor material (underlying layer 107) is uncovered. Most of the conformal film is etched approximately equally, which means that conformal film on the underlying layer between sidewall depositions is removed, uncovering a portion of the underlying layer. This leaves conformal film on sidewalls of the mandrels 110 resulting in spacers 116. In other words, horizontal depositions are removed while vertical depositions remain. The rounding of the conformal film 115 is carried through this spacer open etch resulting in spacers 116 having a sloped top surface with a taller side adjacent to the mandrel 110.

Figure 3:
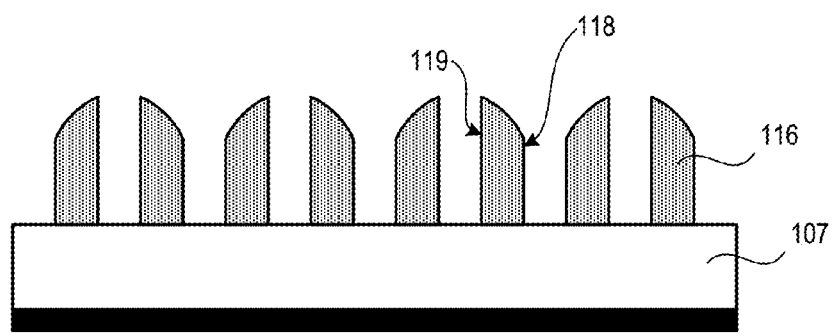
FIG. 3 is a cross-sectional schematic view of an example substrate segment showing formed spacers according to embodiments disclosed herein.
Figure 8:
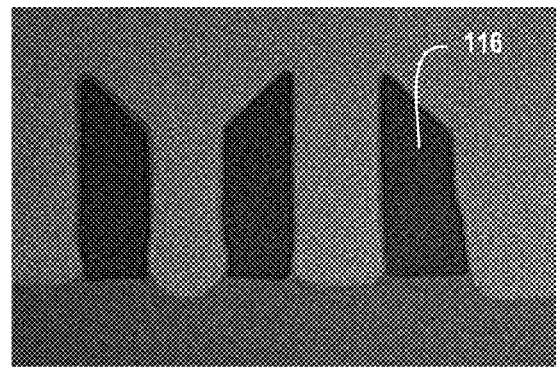
FIG. 8 is a magnified image showing a cross-section of spacers having an asymmetric spacer profile.

With spacers 116 having been created, the mandrels 110 can be removed. FIG. 3 shows an example result. Spacers 116 are essentially now mandrels, but with a greater density (greater number per unit area) as compared to mandrels 110. The number of mandrels has essentially been doubled. But the disadvantage with spacers 116 is the asymmetric profile. As can be seen in FIG. 3, the spacers 116 have a sloped top surface. FIG. 8 is a magnified image showing an actual profile of spacers after the spacer open etch and after mandrels 110 have been removed.

The resulting slope of the spacer top surface creates challenges for continued micro fabrication. For example, during a directional etch for pattern transfer, ions are directed toward substrate 105 at an angle normal to the substrate. The slope of the spacer 116 on spacer side 118 causes the behavior of off-normal ions to be different during pattern transfer. Transferring a pattern using asymmetric spacers can result in higher roughness on the spacer side as compared to mandrel side, undercut at the underlying layers on spacer side, and create spacer side profile differences as compared to mandrel side. While the mandrel side is mostly immune to the off-normal ions, off-normal ions on the spacer side can potentially damage the spacer mask, which can be due to specular reflection of off-normal ions. Thus, a spacer mask height difference between the spacer side and mandrel side can cause significant differences between spacer side and mandrel side post pattern transfer etches.

Techniques herein, however provide a spacer-based patterning process that eliminates these challenges by reforming or reshaping spacer profiles.

One embodiment includes a method for processing a substrate for spacer reformation. Referring again to FIG. 3, a substrate is received having spacers 116 positioned on an underlying layer 107 with the spacers defining a relief pattern. In other words, mandrels 110 that were used to form the spacers 116 have been removed. Each spacer has a first sidewall (such as mandrel side 119) and a second sidewall (such as spacer side 118) on opposing sides of each spacer. The first sidewall and the second sidewall are normal to the underlying layer 107 or have a surface that is essentially perpendicular to the underlying layer 107 or floor of the substrate. The first sidewall is greater in height as compared to the second sidewall. In other words, the first sidewall is taller than the second sidewall. Thus, spacers are created that have an angled or curved top surface instead of a desirable horizontal (flat) surface.

Figure 4:
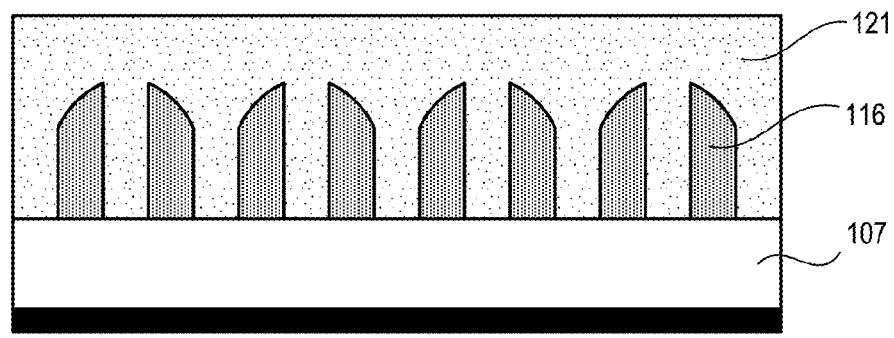
FIG. 4 is a cross-sectional schematic view of an example substrate segment showing spacer reformation flow according to embodiments disclosed herein.

Referring now to FIG. 4, a filler material 121 is then deposited on the substrate 105. The filler material 121 fills spaces between spacers 116 and can also planarize the substrate such that the spacers are buried. The filler material can be deposited by executing a spin-on deposition step that deposits liquid filler material while the substrate is spinning. A semiconductor manufacturing coater/developer tool can be used for this spin-on deposition step. Various types of filler materials can be deposited by spin-on deposition. Example materials can include organic material, hard mask material, metal-containing material, etc. Alternatively, a selective deposition step can be executed that deposits filler material between spacers, leaving the fill material at a same height across the substrate but without covering the spacers. Such selective deposition is challenging. Alternatively, filler material deposition can be executed using chemical vapor deposition, especially if CVD deposited material forms a planar layer.

Figure 5:
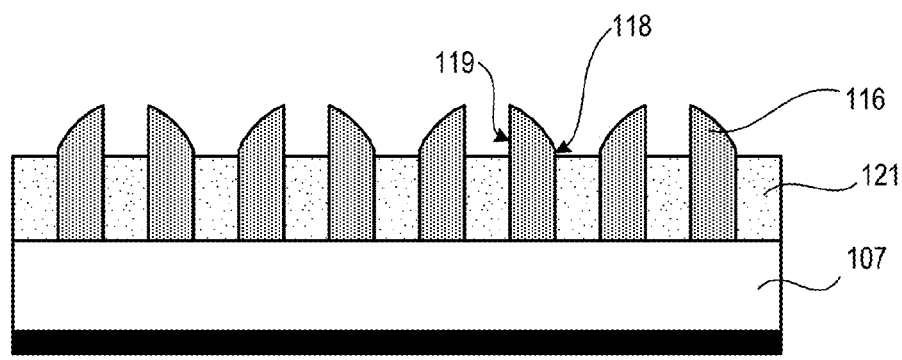
FIG. 5 is a cross-sectional schematic view of an example substrate segment showing spacer reformation flow according to embodiments disclosed herein.

A first etch step is then executed that etches a first portion of the filler material until uncovering a top portion of the spacers such that a top of the first sidewall (such as mandrel side 119) and a top of the second sidewall (such as spacer side 118) are both uncovered. In other words, an etch back (partial etch) of the filler material 121 is executed to uncover tips of the spacers 116. Note that this partial etch can be continued until essentially uncovering top surfaces of the spacers 116. In most embodiments this results in a relative greater portion of the first sidewall being uncovered, while the second sidewall is uncovered relatively little. It is not necessary for the second sidewall to be uncovered as the filler material can be pulled down until a corner, where the top surface of the mandrels meets the second sidewall, is reached. In practice it can be easier to pull down the filler material below both top corners (edges) of the spacers 116 so that the angled tip of the spacers 116 is fully uncovered. Thus, the first etch step is executed until uncovering top surfaces of the spacers and uncovering the top portion of the spacers that is asymmetric in profile. FIG. 5 illustrates an example result after such etch back of filler material.

In one embodiment, this first etch step is a plasma-based anisotropic etch step. Various techniques can be used to determine when to stop the first etch step. For example, a calculation based on etch rate can be used. Alternatively, endpoint detection techniques (such as mass spectrometry) can be used to detect when the buried spacers have been uncovered.

A second etch step is executed that isotropically etches the substrate until the top of the first side wall and the top of the second sidewall are approximately equal in height as measured from the underlying layer or from a base of the spacers. In other words, this second etch step is executed until the spacers have a flat top surface. Thus, the second etch step is executed until the top portion, of the spacers, that is asymmetric in profile is removed resulting in spacers having a symmetric, cross-sectional profile.

Figure 6:
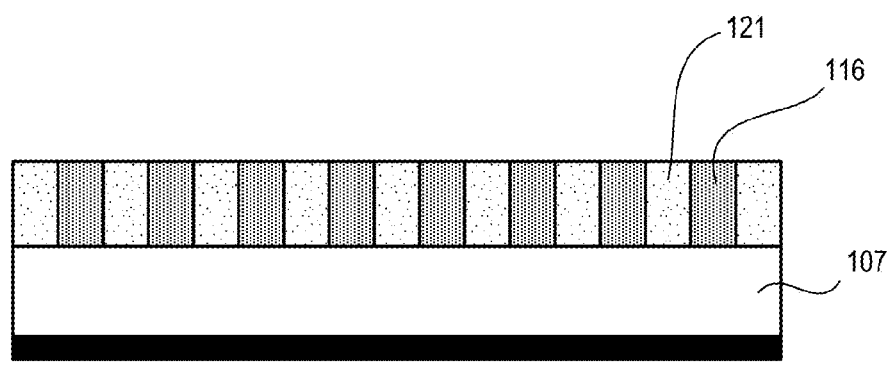
FIG. 6 is a cross-sectional schematic view of an example substrate segment showing spacer reformation flow according to embodiments disclosed herein.

The second etch step uses a plasma etch chemistry that etches the spacers at an etch rate that is greater than at least five times an etch rate of the filler material. In other words, an etch chemistry is used that is highly selective to the filler material so that the filler material remains largely intact as etchants wear down pointed spacers into a flat surface that is flat horizontally or parallel to the underlying layer or substrate itself. FIG. 6 shows an example result.

Spacer etching to reform spacer tops can be executed using various plasma etch chemistries. Actual chemistries selected depend on type of spacer material and type of filler material. One example embodiment can include using an etch chemistry that has a high selectivity to organic material as compared to the spacer being reformed. Example chemistry selections can include fluorine, chlorine or bromine based feed gas such as $C_xF_y$ (such as $CF_4$, $C_4F_8$, $C_4F_6$, etc), $C_xH_yF_z$ (such as $CHF_3$, $CH_2F_2$, $CH_3F$, etc), $NF_3$, $SF_6$, $Cl_2$, $BCl_3$, HBr, $CH_4$ etc., with or without, noble gas diluents such as Ar, He, Xe, etc., or additives such as $O_2$, $N_2$, $CO_2$, COS, etc. Alternatively, and depending on spacer material properties, a wet etch can be executed for the second etch step.

Figure 7:
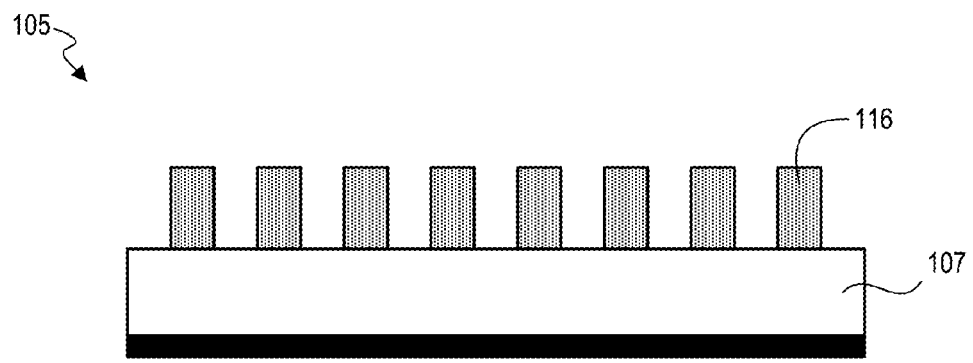
FIG. 7 is a cross-sectional schematic view of an example substrate segment showing spacer reformation flow according to embodiments disclosed herein.

After etching spacer tops to create flat-surfaced spacers, the filler material 121 is removed from the substrate such that the spacers 116 remain on the substrate. When organic material is used for the filler material, then an ashing process can be executed in an ashing chamber or plasma processing chamber. When the filler is selected from a non-organic material or from a metal-containing material, then a wet clean can be used to dissolve and remove the filler material. Thus, removing the filler material can depend on type of filler material being used as well as type of spacer material. FIG. 7 shows an example result with filler material removed and spacers 116 remaining.

Figure 9:
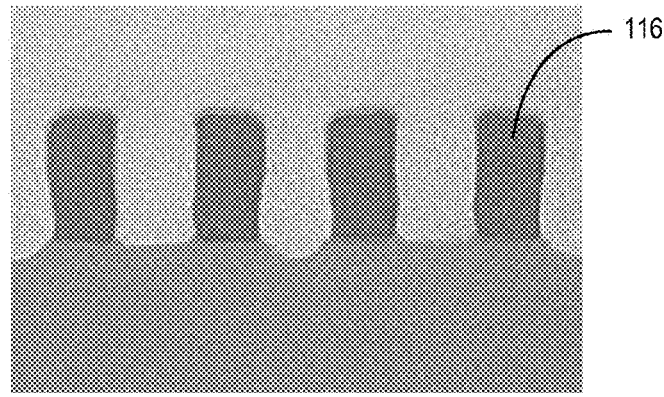
FIG. 9 is a magnified image showing a cross-section of reformed spacers having a symmetric spacer profile according to embodiments herein.

Accordingly, the spacers, prior to depositing the filler material, can have a curved top surface or sloped top surface from a top of the first sidewall to a top of the second sidewall. FIG. 8 shows a magnification of an incoming spacer profile. Using techniques herein, spacers are reformed result in a horizontal surface after completing the second etch step with processing herein. FIG. 9 shows a magnification of a resulting spacer profile. Note that a top portion of the spacers now has a profile that is substantially flat or squared.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for processing a substrate, the method comprising:
   receiving a substrate having spacers positioned on an underlying layer, the spacers defining a relief pattern, each spacer having a first sidewall and a second sidewall on opposing sides of each spacer, the first sidewall and the second sidewall being normal to the underlying layer, the first sidewall being greater in height as compared to the second sidewall;
   depositing a filler material on the substrate, the filler material filling spaces between the spacers, the filler material planarizing the substrate such that the spacers are buried;
   executing a first etch step that etches a first portion of the filler material until uncovering a top portion of the spacers such that a top of the first sidewall and a top of the second sidewall are both uncovered;
   executing a second etch step that isotropically etches the substrate until the top of the first side wall and the top of the second sidewall are approximately equal in height as measured from the underlying layer, the second etch step using a plasma etch chemistry that etches the spacers at an etch rate that is greater than at least five times an etch rate of the filler material; and
   removing the filler material from the substrate such that the spacers remain on the substrate.

2. The method of claim 1, wherein depositing the filler material includes executing a spin deposition step that deposits liquid filler material while the substrate is spinning.

3. The method of claim 2, wherein depositing the filler material includes depositing an organic planarization layer.

4. The method of claim 2, wherein depositing the filler material include depositing a metal-containing material.

5. The method of claim 1, wherein depositing the filler material includes executing a chemical vapor deposition step that deposits the filler material between the spacers.

6. The method of claim 1, wherein the spacers, prior to depositing the filler material, have a curved top surface extending from a top of the first sidewall to a top of the second sidewall, and wherein the spacers result in a horizontal top surface after completing the second etch step.

7. The method of claim 1, wherein the spacers, prior to depositing the filler material, have a sloped top surface extending from a top of the first sidewall to a top of the second sidewall, and wherein the spacers result in a horizontal surface after completing the second etch step.

8. The method of claim 1, wherein executing the first etch step includes executing an anisotropic etch.

9. The method of claim 1, wherein executing the first etch step includes executing a wet chemistry etch.

10. The method of claim 1, wherein removing the filler material from the substrate includes executing an ashing process.

11. The method of claim 1, wherein removing the filler material from the substrate includes executing a wet clean.

12. A method for processing a substrate, the method comprising:

receiving a substrate having spacers positioned on an underlying layer, the spacers defining a relief pattern, each spacer having a first sidewall and a second sidewall on opposing sides of each spacer, the first sidewall and the second sidewall being normal to the underlying layer, the first sidewall being greater in height as compared to the second sidewall such that each spacer has a top portion that is asymmetric in profile;

depositing a filler material on the substrate, the filler material filling spaces between the spacers, the filler material planarizing the substrate such that the spacers are buried;

executing a first etch step that etches a first portion of the filler material until uncovering top surfaces of the spacers and uncovering the top portion of the spacers that is asymmetric in profile;

executing a second etch step that isotropically etches the substrate until the top portion of the spacers that is asymmetric in profile is removed, the second etch step using a plasma etch chemistry that etches the spacers at an etch rate that is greater than at least five times an etch rate of the filler material; and removing the filler material from the substrate such that the spacers remain on the substrate.

\* \* \* \* \*

UNITED STATES PATENT AND TRADEMARK OFFICE
CERTIFICATE OF CORRECTION

PATENT NO. : 9,812,325 B2
APPLICATION NO. : 15/255863
DATED : November 7, 2017
INVENTOR(S) : Nihar Mohanty et al.

Page 1 of 1

It is certified that error appears in the above-identified patent and that said Letters Patent is hereby corrected as shown below:

On the Title Page

Column 2, Item (57), Abstract, Lines 4-5, "profiles with a curved" should read --profiles with curved--.

In the Specification

In Column 3, Line 19, "anisotropic (directional etch) that is" should read --anisotropic (directional) etch that is--.

In Column 3, Line 59, "Techniques herein, however provide" should read --Techniques herein, however, provide--.

In Column 5, Line 38, "reformed result in" should read --reformed resulting in--.

In the Claims

In Column 6, Line 56, Claim 4, "material include depositing" should read --material includes depositing--.

Signed and Sealed this
Twenty-eighth Day of August, 2018

Andrei Iancu
*Director of the United States Patent and Trademark Office*